United States Patent [19]

Glover

[11] Patent Number: 5,831,888

[45] Date of Patent: Nov. 3, 1998

[54] AUTOMATIC GAIN CONTROL CIRCUIT AND METHOD

[75] Inventor: Kerry C. Glover, Wylie, Tex.

[73] Assignee: Texas Instruments Incorporated, Dallas, Tex.

[21] Appl. No.: 859,964

[22] Filed: May 21, 1997

[51] Int. Cl.⁶ .................................................. G06G 7/00
[52] U.S. Cl. ......................................................... 364/807
[58] Field of Search ................................... 364/807, 825, 364/715.011, 157; 375/345

[56] References Cited

U.S. PATENT DOCUMENTS

| | | | |
|---|---|---|---|
| 4,626,629 | 12/1986 | Premoli et al. | 379/386 |
| 5,258,933 | 11/1993 | Johnson et al. | 364/602 |
| 5,341,249 | 8/1994 | Abbott et al. | 360/46 |
| 5,463,603 | 10/1995 | Peterson | 360/61 |
| 5,465,205 | 11/1995 | Kamiya | 364/157 |

FOREIGN PATENT DOCUMENTS

| | | |
|---|---|---|
| 0 116 990 | 3/1984 | European Pat. Off. . |
| WO 90/16125 | 1/1990 | WIPO . |

OTHER PUBLICATIONS

"A Simulation Study of Adaptive Reception Schemes for High–Density Digital Magnetic Storage", Bergmans, et al., *IEEE Transactions on Magnetics*, vol. 27, No. 1, Jan. 1991, pp. 717–723.

"An Estimation Technique for Accurately Modeling the Magnetic Recording Channel Including NonLinearities", Lin et al., *IEEE Transactions on Magnetics*, vol. 25, No. 5, Sep. 1989, pp. 4048–4086.

"Error Rate Performance on Experimental Gigabit Per Square Inch Recording Components", Howell et al., *IEEE Transactions On Magnetics*, vol. 26, No. 5, Sep. 1990, pp. 2298–2302.

"Experimental Studies of Nonlinearities in High Density Disk Recording", Lin et al., *IEEE Transactions on Magnetics*, vol. 3, No. 5, Sep. 1992, pp. 3279–3281.

"Application of Partial–response Channel Coding to Magnetic Recording Systems", Kobayashi et al., *IBM J. Res. Development*, Jul. 1970, pp. 368–375.

"Media Selection for High Density Recording Channels", Brandt et al., *IEEE Transactions on Magnetics*, vol. 29, No. 1, Jan. 1993, pp. 183–188.

Lyle J. Fredrickson, "Viterbi Detection of Matched Spectral Null codes for PR4 Systems," *IEEE Transactions on Magnetics*, vol. 28, No. 5, Sep. 1992, pp. 2889–2891.

K. Chopra and D.D. Woods, "A Maxmium Likelihood Peak Detecting Channel," *IEEE Transactions on Magnetics*, vol. 27, No. 6, Nov. 1991, pp. 4819–4821.

(List continued on next page.)

*Primary Examiner*—Tan V. Mai
*Attorney, Agent, or Firm*—W. Daniel Swayze, Jr.; Wade James Brady, III; Richard L. Donaldson

[57] ABSTRACT

An automatic gain control circuit (44) is provided for generating an output gain signal. The automatic gain control circuit (44) includes a full-wave rectifier (70), an adder circuit (74), a multiplier circuit (82), and a low pass filter (86). The full-wave rectifier (70) receives a continuous-time read signal and generates a rectified read signal that is provided to the adder circuit (74). The adder circuit (74) generates an offset signal by taking the difference between the rectified read signal and a threshold signal. The offset signal is provided to the multiplier circuit (82) which multiplies the offset signal by a gain signal, such as a first gain signal or a second gain signal, to generate an error signal. A selection circuit, such as a multiplexer (76), may be provided to determine whether to provide the first gain signal or the second gain signal to the multiplier circuit (82). The multiplexer (76) may be controlled by a comparator (72) that generates a signal indicating whether the rectified read signal is above or below a threshold signal or value. The low pass filter (86) receives the error signal and generates the output gain signal of the automatic gain control circuit (44).

20 Claims, 1 Drawing Sheet

OTHER PUBLICATIONS

Arvind M. Patel, "A New Digital Signal Processing Channel for Data Storage Products," *IEEE Transactions on Magnetics*, vol. 27, No. 6, Nov. 1991, pp. 4579–4584.

Richard C. Schneider, "Sequence (Viterbi–Equivalent) Decoding," *IEEE Transactions on Magnetics*, vol. 24, No. 6, Nov. 1988, pp. 2539–2541.

J.D. Coker, R.L. Galbraith, G.J. Kerwin, J.W. Rae, P.A. Ziperovich, "Implementation of PRML in a Rigid Disk Drive," *IEEE Transactions on Magnetics*, vol. 27, No. 6, Nov. 1991, pp. 4538–4543.

H. Kobayashi and D.T. Tang, "Application of Partial–response Channel Coding to Magnetic Recording Systems," *IBM J. Res. Develop.*, Jul. 1970, pp. 368–375.

Kenneth Abend and Bruce D. Fritchman, "Statistical Detection for Communication Channels with Intersymbol Interference," *Proceedings of the IEEE*, vol. 58, No. 5, May 1970, pp. 779–785.

G. David Forney, Jr., "Maximum–Likelihood Sequence Estimation of Digital Sequences in the Presence of Intersymbol Interference," *IEEE Transactions on Information Theory*, vol. IT–18, No. 3, May 1972, pp. 363–378.

G. David Forney, Jr., "The Viterbi Algorithm," *Proceedings of the IEEE*, vol. 61, No. 3, Mar. 1973, pp. 268–278.

Gottfried Ungerbroeck, "Adaptive Maximum–Likelihood Receiver for Carrier–Modulated Data–Transmission Systems," *IEEE Transactions on Communications*, vol. Com–22, No. 5, May 1974, pp. 624–636.

Peter Kabal and Subbarayan Pasupathy, "Partial–Response Signaling," *IEEE Transactions on Communications*, vol. Com–23, No. 9, Sep. 1975, pp. 921–934.

C.T. Beare, "The Choice of the Desired Impulse Response in Combined Linear–Viterbi Algorithm Equalizers," *IEEE Transactions on Communications*, vol. Com–26, No. 8, Aug. 1978, pp. 1301–1307.

R.A. Baugh, E.S. Murdock, and B.R. Natarajan, "Measurement of Noise in Magnetic Media," *IEEE Transactions on Magnetics*, vol. MAG–19, No. 5, Sep. 1983, pp. 1722–1724.

Hans Burkhardt and Lineu C. Barbosa, "Contributions to the Applications of the Viterbi Algorithm," *IEEE Transactions on Information Theory*, vol. IT–31, No. 5, Sep. 1985, pp. 626–634.

Yaw–Shing Tang, "Noise Autocorrelation in Magnetic Recording Systems," *IEEE Transactions on Magnetics*, vol. MAG–21, No. 5, Sep. 1985, pp. 1389–1394.

Roger W. Wood and David A. Petersen, "Viterbi Detection of Class IV Partial Response on a Magnetic Recording Channel," *IEEE Transactions on Communications*, vol. COM–34, No. 5, May 1986, pp. 454–461.

Yaw–Shing Tang, "Noise Autocorrelation in High Density Recording on Metal Film Disks," *IEEE Transactions on Magnetics*, vol. MAG–22, No. 5, Sep. 1986, pp. 883–885.

C. Michael Melas, Patrick Arnett, Irene Beardsley, and Dean Palmer, "Nonlinear Superposition in Saturation Recording of Disk Media," *IEEE Transactions on Magnetics*, vol. MAG–23, No. 5, Sep. 1987, pp. 2079–2081.

Dean Palmer, Pablo Ziperovich, Roger Wood, and Thomas D. Howell, "Identification of Nonlinear Write Effects Using Pseudorandom Sequences," *IEEE Transactions on Magnetics*, vol. MAG–23, No. 5, Sep. 1987, pp. 2377–2379.

Roger Wood, "Jitter vs. Additive Noise in Magnetic Recording: Effects on Detection," *IEEE Transactions on Magnetics*, vol. MAG–23, No. 5, Sep. 1987, pp. 2683–2685.

H.K. Thapar and A.M. Patel, "A Class of Partial Response Systems for Increasing Storage Density in Magnetic Recording," *IEEE Transactions on Magnetics*, vol. MAG–23, No. 5, Sep. 1987, pp. 3666–3668.

Yinyi Lin and Jack K. Wolf, "Combined ECC/RLL Codes," *IEEE Transactions on Magnetics*, vol. 24, No. 6, Nov. 1988, pp. 2527–2529.

Catherine A. French, Anthony D. Weathers, and Jack Keil Wolf, "A Generalized Scheme for Generating and Detecting Recording Channel Output Waveforms with Controlled Pulse Polarity," *IEEE Transactions on Magnetics*, vol. 24, No. 6, Nov. 1988, pp. 2530–2532.

Richard C. Schneider, "Write Equalization for Generalized (d,k) Codes," *IEEE Transactions on Magnetics*, vol. 24, No. 6, Nov. 1988, pp. 2533–2535.

Michael Melas, Patrick Arnett, and Jaekyun Moon, "Noise in a Thin Metallic Medium: The Connection with Nonlinear Behaviour," *IEEE Transactions on Magnetics*, vol. 24, No. 6, Nov. 1988, pp. 2712–2714.

Jaekyun J. Moon and L. Richard Carley, "Partial Response Signaling in a Magnetic Recording Channel," *IEEE Transactions on Magnetics*, vol. 24, No. 6, Nov. 1988, pp. 2973–2975.

F. Dollvo, R. Hermann, and S. Olcer, "Performance and Sensitivity Analysis of Maximum–Likelihood Sequence Detection on Magnetic Recording Channels," *IEEE Transactions on Magnetics*, vol. 25, No. 5, Sep. 1989, pp. 4072–4074.

Roger Wood, "New Detector for 1,k Codes Equalized to Class II Partial Responses," *IEEE Transactions on Magnetics*, vol. 25, No. 5, Sep. 1989, pp. 4075–4077.

J.W.M. Bergmans, S. Mita, and M. Izumita, "Characterization of Digital Recording Channels by Means of Echo Cancellation Techniques," *IEEE Transactions on Magnetics*, vol. 25, No. 5, Sep. 1989, pp. 4078–4080.

Yinyi Lin, "An Estimation Technique for Accurately Modelling the Magnetic Recording Channel Including Nonlinearities," *IEEE Transactions on Magnetics*, vol. 25, No. 5, Sep. 1989, pp. 4084–4086.

Anthony D. Weathers, Catherine A. French, and Jack Keil Wolf, "Results on 'Controlled Polarity' Modulation and Coding," *IEEE Transactions on Magnetics*, vol. 25, No. 5, Sep. 1989, pp. 4090–4092.

Catherine A. French, "Distance Preserving Run–Length Limited Codes, " *IEEE Transactions on Magnetics*, vol. 25, No. 5, Sep. 1989, pp. 4093–4095.

Lyle J. Frederickson and Jack Keil Wolf, "Error Detecting Multiple Block (d,K) Codes," *IEEE Transactions on Magnetics*, vol. 25, No. 5, Sep. 1989, pp. 4096–4098.

Roger Wood, "Enhanced Decision Feedback Equalization," *IEEE Transactions on Magnetics*, vol. 26, No. 5, Sep. 1990, pp. 2178–2180.

Thomas D. Howell, Donald P. McCrown, Thomas A. Diola, Yaw–shing Tang, Karl R. Hense, Ralph L. Gee, "Error Rate Performance of Experimental Gigabit Per Square Inch Recording Components," *IEEE Transactions on Magnetics*, vol. 26, No. 5, Sep. 1990, pp. 2298–2302.

Pantas Sutardja, "A Post–Compensation Scheme for Peak–Detect Channel," *IEEE Transactions on Magnetics*, vol. 26, No. 5, Sep. 1990, pp. 2303–2305.

L.L. Nunnelley, M.A. Burleson, L.L. Williams, and I.A. Beardsley, "Analysis of Asymmetric Deterministic Bitshift Errors in a Hard Disk File," *IEEE Transactions on Magenetics*, vol. 26, No. 5, Sep. 1990, pp. 2306–2308.

H.K. Thapar, N.P.Sands, W.L. Abbott, and J.M. Cioffi, "Spectral Shaping for Peak Detection Equalization," *IEEE Transactions on Magnetics*, vol. 26, No. 5, Sep. 1990, pp. 2309–2311.

Lyle J. Frederickson, "Coding for Maximum Likelihood Detection on a Magnetic Recording Channel," *IEEE Transactions on Magnetics*, vol. 26, No. 5, Sep. 1990, pp. 2315–2317.

Lyle J. Frederickson, "A (D,K,C) = (0,3,5/2) Rate 8/10 Modulation Code," *IEEE Transactions on Magnetics*, vol. 26, No. 5, Sep. 1990, pp. 2318–2320.

R. Hermann, "Volterra Modeling of Digital Magnetic Saturation Recording Channels," *IEEE Transactions on Magnetics*, vol. 26, No. 5, Sep. 1990, pp. 2125–2127.

Roger Wood, Mason Williams, and John Hong, "Considerations for High Data Rate Recording with Thin–Film Heads," *IEEE Transactions on Magnetics*, vol. 26, No. 6, Nov. 1990, pp. 2954–2959.

Jaekyun Moon and L. Richard Carley, "Performance Comparison of Detection Methods in Magnetic Recording," *IEEE Transactions on Magnetics*, vol. 26, No. 6, Nov. 1990, pp. 3155–3172.

William L. Abbott, John M. Cioffi, and Hemant K. Thaper, "Performance of Digital Magnetic Recording with Equalization and Offtrack Interference," *IEEE Transactions on Magnetics*, vol. 27, No. 1, Jan. 1991, pp. 705–716.

Jan W.M. Bergmans, Seiichi Mita, and Morishi Izumita, "A Simulation Study of Adaptive Reception Schemes for High–Density Digital Magnetic Storage," *IEEE Transactions on Magnetics*, vol. 27, No. 1, Jan. 1991, pp. 717–723.

Ching Tsang and Yaw–Shing Tang, "Time–Domain Study of Proximity–Effect Induced Transition Shifts," *IEEE Transactions on Magnetics*, vol. 27, No. 2, Mar. 1991, pp. 795–802.

K.B. Klaassen, "Magnetic Recording Channel Front–Ends," *IEEE Transactions on Magnetics*, vol. 27, No. 6, Nov. 1991, pp. 4503–4508.

Jong Hong, Roger Wood, David Chan, "An Experimental 180 Mb/sec PRML Channel for Magnetic Recording," *IEEE Transactions on Magnetics*, vol. 27, No. 6, Nov. 1991, pp. 4532–4537.

Jonathan D. Coker, Richard L. Galbraith, and Gregory J. Kerwin, "Magnetic Characterization using Elements of a PRML Channel," *IEEE Transactions on Magnetics*, vol. 27, No. 6, Nov. 1991, pp. 4544–4548.

L. Richard Carley and John G. Kenney, "Comparison of Computationally Efficient Forms of FDTS/DF Against PR4–ML," *IEEE Transactions on Magnetics*, vol. 27, No. 6, Nov. 1991, pp. 4567–4572.

Jaekyun Moon, "Discrete–Time Modeling of Transition––Noise Dominant Channels and Study of Detection Performance," *IEEE Transactions on Magnetics*, vol. 27, No. 6, Nov. 1991, pp. 4573–4578.

Jack Keil Wolf, "A Survey of Codes for Partial Response Channels," *IEEE Transactions on Magnetics*, vol. 27, No. 6, Nov. 1991, pp. 4585–4589.

Norman L. Koren, "Matched Filter Limits and Code Performance in Digital Magnetic Recording," *IEEE Transactions on Magnetics*, vol. 27, No. 6, Nov. 1991, pp. 4594–4599.

H.M. Hilden, D.G. Howe, and E.J. Weldon, Jr., "Shift Error Correcting Modulation Codes," *IEEE Transactions on Magnetics*, vol. 27, No. 6, Nov. 1991, pp. 4600–4605.

Derek D. Kumar and Bill J. Hunsinger," ACT–enabled 100MHz Channel Equalizer," *IEEE Transactions on Magnetics*, vol. 27, No. 6, Nov. 1991, pp. 4799–4803.

Alan J. Armstrong and Jack Keil Wolf, "Performance Evaluation of a New Coding Scheme for the Peak Detecting Magnetic Recording Channel," *IEEE Transactions on Magnetics*, vol. 27, No. 6, Nov. 1991, pp. 4804–4806.

S. Raghavan and H.K. Thapar, "Feed–Forward Recovery for Digital Magnetic Recording," *International Conference on Communications Conference Record*, vol. 2, 1991, pp. 794–798.

S.A. Raghavan and H.K. Thapar, "On Feed–Forward and Feedback Timing Recovery for Digital Magnetic Recording Systems," *IEEE Transactions on Magnetics*, vol. 27, No. 6, Nov. 1991, pp. 4810–4812.

James Fitzpatrick and Jack Keil Wolf,"A Maximum Likelihood Detector for Nonlinear Magnetic Recording," *IEEE Transactions on Magnetics*, vol. 27, No. 6, Nov. 1991, pp. 4816–4818.

John G. Kenney, Peter Alexis McEwen, and L. Richard Carley, "Evaluation of Magnetic Recording Detection Schemes for Thin Film Media," *IEEE Transactions on Magnetics*, vol. 27, No. 6, Nov. 1991, pp. 4822–4824.

Pablo A. Ziperovich, "Performance Degradation of PRML Channels Due to Nonlinear Distortions," *IEEE Transactions on Magnetics*, vol. 27, No. 6, Nov. 1991, pp. 4825–4827.

Jaekyun Moon and Jian–Gang Zhu, "Nonlinear Effects of Transition Broadening," *IEEE Transactions on Magnetics*, vol. 27, No. 6, Nov. 1991, pp. 4831–4833.

Jaekyun Moon, "Signal–to–Noise Ratio Degradation with Channel Mismatch," *IEEE Transactions on Magnetics*, vol. 27, No. 6, Nov. 1991, pp. 4837–4839.

R.D. Barndt, A.J. Armstrong, H.N. Bertram, and J.K. Wolf, "A Simple Statistical Model of Partial Erasure in Thin Film Disk Recording Systems," *IEEE Transactions on Magnetics*, vol. 27, No. 6, Nov. 1991, pp. 4978–4980.

Y. Tang and C. Tsang, "A Technique for Measuring Nonlinear Bit Shift," *IEEE Transactions on Magnetics*, vol. 27, No. 6, Nov. 1991, pp. 5316–5318.

R.D. Barndt and J.K. Wolf, "Modeling and Signal Processing for the Nonlinear Thin Film Recording Channel," *IEEE Transactions on Magnetics*, vol. 28, No. 5, Sep. 1992, pp. 2710–2712.

H. Thapar, J. Rae, C. Chung, R. Karabed, and P. Siegel, "On the Performance of a Rate 8/10 Matched Spectral Null Code for Class–4 Partial Response," *IEEE Transactions on Magnetics*, vol. 28, No. 5, Sep. 1992, pp. 2883–2888.

Hamid Shafiee and Jaekyun Moon, "Low–Complexity Viterbi Detection for a Family of Partial Response System\," *IEEE Transactions on Magnetics*, vol. 28, No. 5, Sep. 1992, pp. 2892–2894.

Weining Zeng and Jaekyun Moon, "Modified Viterbi Algorithm for a Jitter–dominant $1-D^2$ Channel," *IEEE Transactions on Magnetics*, vol. 28, No. 5, Sep. 1992, pp. 2895–2897.

William E. Ryan, "Comparative Performance Between Drop–Out Detection and Viterbi Reliability Metric Erasure Flagging," *IEEE Transactions on Magnetics*, vol. 28, No. 5, Sep. 1992, pp. 2898–2900.

C. Menyennett, L. Botha, and H.C. Ferreira, "A NewRunlength Limited Code for Binary Asymmetric Channels," *IEEE Transactions on Magnetics*, vol. 28, No. 5, Sep. 1992, pp. 2901–2903.

Gang H. Lin, Rick Barndt, H. Neal Bertram, and Jack K. Wolf, "Experimental Studies of Nonlinearities in High Density Disk Recording," *IEEE Transactions on Magnetics*, vol. 28, No. 5, Sep. 1992, pp. 3279–3281.

Ralph Simmons and Robert Davidson, "Media Design for User Density of up to 3 Bits per Pulse Width," *IEEE Transactions on Magnetics*, vol. 29, No. 1, Jan. 1993, pp. 169–176.

Jaekyun Moon and Jian–Gang Zhu, "Nonlinearities in Thin–Film Media and Their Impact on Data Recovery," *IEEE Transactions on Magnetics*, vol. 29, No. 1, Jan. 1993, pp. 177–182.

R.D. Barndt, A.J. Armstrong, and J.K. Wolf, "Media Selection for High Density Recording Channels," *IEEE Transactions on Magnetics*, vol. 29, No. 1, Jan. 1993, pp. 183–188.

Dean C. Palmer and Jonathan D. Coker, "Media Design Considerations for a PRML Channel," *IEEE Transactions on Magnetics*, vol. 29, No. 1, Jan. 1993, pp. 189–194.

Zadian Software, Inc., *Disk Drive Technology*, Copyright 1990, San Jose, CA.

Roy D. Cideciyan, Francois Dolivo, Reto Hermann, Walter Hirt, and Wolfgang Schott, "A PRML System for Digital Magnetic Recording," *IEEE Journal on Selected Areas in Communications*, vol. 10, No. 1, Jan. 1992, pp. 38–56.

AUTOMATIC GAIN CONTROL CIRCUIT AND METHOD

TECHNICAL FIELD OF THE INVENTION

This invention relates generally to the field of information storage and more particularly to an automatic gain control circuit and method.

BACKGROUND OF THE INVENTION

As computer hardware and software technology continues to progress, the need for larger and faster mass storage devices for storing computer software and data continues to increase. Electronic databases and computer applications such as multimedia applications require large amounts of disk storage space.

To meet these ever increasing demands, the hard disk drive (HDD) continues to evolve and advance. Some of the early disk drives had a maximum storage capacity of five megabytes and used fourteen inch platters, whereas today's HDDs are commonly over one gigabyte and use 3.5 inch platters. Advances in the amount of data stored per unit of area, or areal density, have dramatically accelerated. For example, in the 1980's, areal density increased about thirty percent per year while in the 1990's annual areal density increases have been around sixty percent. Areal density may be increased by increasing the rate at which data may be stored and retrieved. The cost per megabyte of an HDD is inversely related to its areal density.

In general, mass storage devices and systems, such as HDDs, include a magnetic storage media, such as rotating disks or platters, a spindle motor, read/write heads, an actuator, a pre-amplifier, a read channel, a write channel, a servo controller, a memory, and control circuitry to control the operation of the HDD and to properly interface the HDD to a host or system bus. The read channel, write channel, servo controller, and memory may all be implemented as one integrated circuit that is referred to as a data channel. The control circuitry often includes a microprocessor for executing control programs or instructions during the operation of the HDD.

An HDD performs write, read, and servo operations when storing and retrieving data. A typical HDD performs a write operation by transferring data from a host interface to its control circuitry. The control circuitry then stores the data in a local dynamic random access memory (DRAM). A control circuitry processor schedules a series of events to allow the information to be transferred to the disk platters through a write channel. The read/write heads are moved to the appropriate track and sector. Finally, the HDD control circuitry transfers the data from the DRAM to the sector using the write channel. A sector generally has a fixed data storage capacity, such as 512 bytes of user data per sector. A write clock controls the timing of a write operation in the write channel. The write channel may encode the data so that the data can be more reliably retrieved later.

In a read operation, the appropriate sector to be read is located and data that has been previously written to the disk is read. A read/write head senses the changes in the magnetic flux of the disk platter and generates a corresponding analog read signal. The read channel receives the analog read signal, conditions the signal, and detects "zeros" and "ones" from the signal. The read channel conditions the signal by amplifying the read signal to an appropriate level using an automatic gain control circuit. The read channel then filters the signal, to eliminate unwanted high frequency noise, equalizes the channel, detects "zeros" and "ones" from the signal, and formats the binary data for the control circuitry. The binary or digital data is then transferred from the read channel to the control circuitry and is stored in the DRAM. The processor then communicates to the host that data is ready to be transferred. A read clock controls the timing of a read operation in the read channel. The goal during a read operation is to accurately retrieve the data with the lowest bit error date (BER) in the noisiest environment.

The goal of the automatic gain control circuit during a read operation is to generate an appropriate output gain signal so that the read signal may be efficiently and accurately analyzed by the read channel. The automatic gain control circuit often uses peak tracking techniques to establish an appropriate gain to be applied to the read signal. Peak tracking involves following the peak of the read signal and calculating a corresponding output gain signal in response. For example, if the peak is too high, the output gain signal is reduced, and if the peak is too low, the output gain signal is increased. Peak tracking does not provide the desired speed needed in high performance HDD systems. Peak tracking also suffers the added disadvantage of gain overshoot and undershoot when read signals are provided having non-sinusoidal waveforms. The overshoot and undershoot harms overall HDD performance by increasing the time needed by the automatic gain control circuit to reach steady state and to provide the appropriate output gain signal.

The problem of overshoot and undershoot is especially troubling in more advanced mass storage systems using magneto-resistive heads. Such advanced systems include those utilizing discrete time signal processing to reconstruct the original data written to the disk. In such systems, the read signal is synchronously sampled using a data recovery clock. The sample is then processed through a series of mathematical manipulations using signal processing theory such as partial response, maximum likelihood detection. The magneto-resistive heads used in these systems often provide read signals having non-sinusoidal waveforms causing the automatic gain control circuit to overshoot and undershoot. To compensate for such problems, the automatic gain control circuit must be given more time to determine the appropriate gain. This added time means that more of the HDD capacity must be dedicated to providing header information including an automatic gain control signal. As a consequence, overall HDD capacity is reduced because the remaining available capacity for actual data storage is reduced.

In a servo operation, the servo controller is used, while the disk platters are moving, to align the read/write heads with a particular track. The servo controller generates position error signals (PES) and provides them to the control circuitry during read and write operations. The PES relate to the position of the heads on particular tracks so that the heads can be properly positioned for both read and write operations. The PES are generated by reading information from the disk called a servo wedge. Generally, each sector has a corresponding servo wedge. The servo wedge indicates the position of the heads. The automatic gain control circuit may be used to generate a servo gain signal so that the servo wedge may be properly read by the servo controller.

Problems arise when an automatic gain control circuit using peak tracking techniques is used to generate a servo gain signal. These problems ultimately result in reduced HDD capacity. As discussed above with respect to generating an output gain signal, peak tracking techniques may result in overshoot and undershoot in the generation of the servo gain signal which increases the time needed for the automatic gain control circuit to reach steady state. The automatic gain control circuit must be given more time to determine the appropriate servo gain signal. This added time means that more of the HDD capacity must be dedicated to providing the servo wedge information. As a consequence, overall HDD capacity is reduced because the remaining available capacity, or bits per inch, available for actual data storage is reduced.

Other problems arise when an automatic gain control circuit using peak tracking techniques is used to generate a servo gain signal that is provided to a servo controller using area integration techniques. The combination of using peak tracking and area integration techniques may lead to non-linearities in the ultimate servo response. In order to compensate for these non-linearities, the width of the tracks on the disk must be increased so that the inaccurate position error signal may be used. As a result of this increase in track width, the overall number of tracks per inch is reduced and overall HDD capacity is reduced. This is because fewer tracks are available to store user data.

SUMMARY OF THE INVENTION

From the foregoing it may be appreciated that a need has arisen for an automatic gain control circuit and method. In accordance with the present invention, an automatic gain control circuit and method for quickly and accurately generating an output gain signal is provided which substantially eliminates or reduces the disadvantages and problems of previously developed circuits and methods. The present invention, using area integration techniques, quickly and accurately generates an output gain signal based on a read signal having either a sinusoidal or a non-sinusoidal waveform. The present invention may also be used to quickly and accurately generate a servo gain signal. The area integration techniques used in the present invention eliminate the non-linearities that result from coupling an automatic gain control circuit using peak tracking techniques to a servo controller which uses area integration techniques.

According to the present invention, an automatic gain control circuit is provided for generating an output gain signal for use in a read channel. The automatic gain control circuit includes a rectifier circuit, an adder circuit, a multiplier circuit, and a filter. The rectifier circuit receives a read signal and generates a rectified read signal in response. The adder circuit generates an offset rectified read signal or offset signal by subtracting a threshold signal from the rectified read signal. The multiplier circuit receives the offset signal and multiplies the offset signal with a gain signal to generate an error signal that is provided to the filter. The filter then filters the error signal and provides an output gain signal.

The present invention provides various technical advantages. A technical advantage of the present invention includes the ability to quickly and accurately generate an accurate output gain signal or a servo gain signal while increasing overall storage capacity. Overall storage capacity is increased by reducing the amount of storage capacity dedicated to providing header information or servo wedge information. Another technical advantage includes increased servo performance which results in greater track density and hence increased overall HDD capacity. Yet another technical advantage of the present invention allows read signals having non-sinusoidal waveforms, such as those provided by magneto-resistive heads, to be accurately processed so that the appropriate output gain signal can be quickly and accurately generated. Other technical advantages are readily apparent to one skilled in the art from the following figures, description, and claims.

BRIEF DESCRIPTION OF THE DRAWINGS

For a more complete understanding of the present invention and the advantages thereof, reference is now made to the following brief description, taken in connection with the accompanying drawings and detailed description, wherein like reference numerals represent like parts, in which.

DETAILED DESCRIPTION OF THE INVENTION

Figure 1:
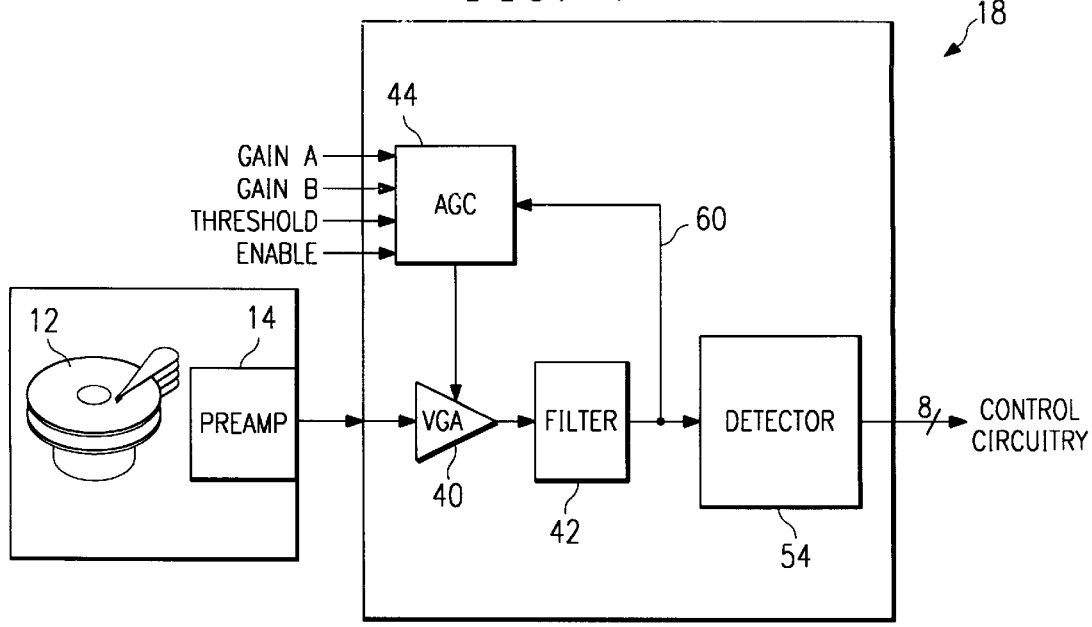
FIG. 1 is a block diagram illustrating a read channel of a disk drive mass storage system.

FIG. 1 is a block diagram of read channel 18 of a disk drive mass storage system. Read channel 18 is used to process and condition an analog read signal received from a preamplifier 14 and a disk/head assembly 12 during a read operation. Read channel 18 includes a variable gain amplifier 40, an automatic gain control circuit 44, a filter 42, and a detector 54. All of these circuit modules are used during a read operation to perform various functions in processing and conditioning the analog read signal so that a corresponding digital data signal may be provided at the output of read channel 18. The digital data signal is provided to control circuitry of the disk drive mass storage system and then to a host or system bus.

Data is stored on the disks of disk/head assembly 12 and is organized into sectors. The data is provided from each sector in the form of an analog read signal. Each sector contains header information and user data, the header information is provided to read channel 18 before the user data. The header information is used by automatic gain control circuit 44 of read channel 18 to establish an appropriate gain to apply to the analog read signal when user data is being processed by read channel 18. The header information may also contain servo wedge information. A synchronization field is provided in each sector that serves to separate the header information from the user data.

Variable gain amplifier 40 receives the header information in the form of the analog read signal provided by preamplifier 14 and an output gain signal provided by automatic gain control circuit 44. Variable gain amplifier 40 generates an amplified read signal by amplifying the analog read signal an amount determined by the output gain signal. Variable gain amplifier 40 may be a differential analog amplifier with variable gain. Filter 42 receives the amplified read signal and removes undesirable noise, such as high frequency noise, and generates a filtered read signal 60. Filter 42 may be a continuous-time 7th order filter designed using Gm/C components and may have a programmable cutoff frequency. Filtered read signal 60 is provided to automatic gain control circuit 44 and detector 54 as a continuous-time signal.

Automatic gain control circuit 44, described more fully below with respect to FIG. 2, receives filtered read signal 60 and generates the output gain signal used by variable gain amplifier 40. In generating the output gain signal, automatic gain control circuit 44 uses a first gain signal, shown as Gain A, a second gain signal, shown as Gain B, a threshold signal, and an enable signal. The enable signal is generally provided in an enabled state during the time in which the header information is provided through the analog read signal.

Automatic gain control circuit 44, variable gain amplifier 40, and filter 42 function as a control loop for generating the output gain signal. This control loop processes the analog read signal during the time in which the header information is provided. During this time, the control loop will respond to the analog read signal and will settle to a steady state level resulting in a stable output gain signal being provided to variable gain amplifier 40. Typically, after the header information has been provided, automatic gain control circuit 44 maintains this stable output gain signal for use during the processing of the analog read signal containing user data by read channel 18.

Detector 54 may include only a data signal detector or both a data signal detector and a servo signal detector. The servo signal detector may be referred to as a servo controller. When read channel 18 is processing user data, the data signal detector is active, and when read channel 18 is processing servo data, the servo signal detector is active. The data signal detector receives filtered read signal 60 and generates a digital data signal corresponding to the data stored on disk/head assembly 12. The data signal detector may be implemented using any of a variety of circuitry using various techniques for extracting or detecting digital information from filtered read signal 60. For example, the data signal detector may be implemented as a peak detection system or as a discrete time signal processing system such as a synchronously sampled system using partial response, maximum likelihood (PRML) detection techniques. The systems implementing PRML techniques generally employ a Viterbi decoder implementing the Viterbi algorithm, named after Andrew Viterbi who developed it in 1967. After receiving the synchronization field, the data signal detector provides user data, in digital, parallel format, to the control circuitry.

The servo signal detector receives filtered read signal 60 and generates a number of servo levels or position error signals corresponding to the location of the head on the disk. The servo signal detector may function as a servo controller and may be implemented using an area integration technique where the output signal is proportional to the area of the servo waveform or filtered read signal 60.

Figure 2:
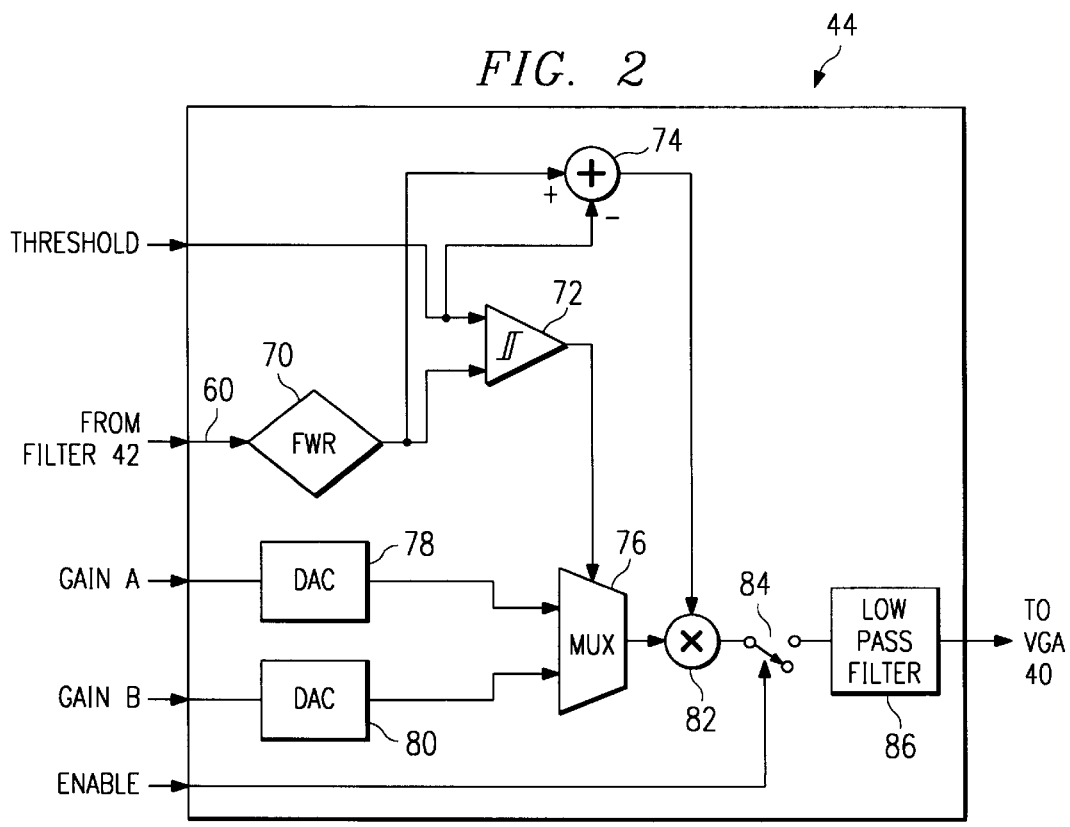
FIG. 2 is a diagram illustrating an automatic gain control circuit of the read channel.

FIG. 2 is a diagram illustrating automatic gain control circuit 44 of read channel 18. Automatic gain control circuit 44 includes a variety of circuitry used to receive filtered read signal 60 from filter 42 and to generate an output gain signal that is provided to variable gain amplifier 40. Automatic gain control circuit 44 includes a full wave rectifier 70 for receiving filtered read signal 60 from filter 42 and rectifying the signal to generate a rectified read signal. The rectified read signal is provided to an adder circuit 74 and a comparator 72.

In addition to the rectified read signal, comparator 72 also receives a threshold signal and compares the threshold signal to the rectified read signal to generate a comparison signal that indicates whether the rectified read signal is above or below the threshold signal. For example, comparator 72 may generate a digital comparison signal which is equal to a value of "one" when the rectified read signal is greater than the threshold signal and is equal to a value of "zero" when the rectified read signal is less than the threshold signal. The threshold signal may be a programmable value that can be provided over a range of values. The comparison signal is provided to a multiplexer 76 and controls its operation.

Adder circuit 74 receives the rectified read signal along with the threshold signal. Adder circuit 74 subtracts the value of the threshold signal from the value of the rectified read signal to generate the offset signal. Other embodiments of the present invention, not shown in FIG. 2, may include other circuitry for determining the difference between the rectified read signal and the threshold signal. Furthermore, the threshold signal provided to adder circuit 74 is shown in FIG. 2 as being the same threshold signal that is provided to comparator 72. In actual practice, the threshold signal may be provided as two separate signals having different values.

Automatic gain control circuit 44 also receives Gain A and Gain B which are provided to a first digital-to-analog converter 78 and a second digital-to-analog converter 80, respectively. Gain A and Gain B may be programmable values. First digital-to-analog converter 78 and second digital-to-analog converter 80 receive their respective signals and convert them from the digital domain to the analog domain. The output of first digital-to-analog converter 78 and second digital-to-analog 80 are provided as inputs to multiplexer 76.

Multiplexer 76 operates as a selection circuit and is controlled by the comparison signal provided by comparator 72. Multiplexer 76 selects either Gain A or Gain B, as determined by the comparison signal, to be provided at the output of multiplexer 76. Whenever the comparison signal indicates that the rectified read signal is greater than the threshold signal, Gain A is provided at the output of multiplexer 76. Conversely, whenever the rectified read signal is less than the threshold signal, Gain B is provided as the output of multiplexer 76.

Gain A and Gain B are gain signals that are ultimately multiplied, as described below, with the offset signal. The value of the signals may be equivalent but will generally be provided at some ratio of one another.

A multiplier circuit 82 receives the output of multiplexer 76 and the offset signal of adder circuit 74. Multiplier 84 multiplies these two signals and generates an error signal. The error signal is then provided to low pass filter 86 whenever enable switch 84 is closed. Enable switch 84 is controlled by an enable signal. The enable signal typically closes enable switch 84 when the analog read signal contains the header information. This normally occurs before user data is provided from a sector.

Low pass filter 86 receives and filters the error signal when enable switch 84 is closed. Low pass filter 86 generates an output gain signal in response. The output gain signal is provided to variable gain amplifier 40 and controls the gain or amplification provided to the analog read signal. The output gain signal is an area integration of the error signal provided by multiplier circuit 82. Once enable switch 84 is opened, low pass filter 86 will maintain the last output gain signal generated. This signal will be provided to variable gain amplifier 40 while the analog read signal provides user data from the sector being read.

Low pass filter 86 may be implemented using any of a variety of circuit elements. For example, low pass filter 86 may be implemented using passive components such as a resistor and a capacitor, or using active components such as an operational amplifier. Low pass filter 86 will generally be designed to ensure low current leakage so that the output gain signal can be accurately maintained. The output gain signal will generally be maintained throughout the time in which the user data portion of the sector is being provided to variable gain amplifier 40.

In operation, a read operation is initiated in read channel 18 when a read control signal is enabled. Once the read control signal is enabled, variable gain amplifier 40 receives an analog read signal containing the header information. Filter 42 receives the analog read signal and filters the signal to generate filtered read signal 60. Automatic gain control circuit 44 receives filtered read signal 60 from filter 42. Full wave rectifier 70 receives this signal and rectifies the signal to generate the rectified read signal. The rectified read signal is provided to adder circuit 74 and comparator 72.

Comparator 72 generates a comparison signal indicating whether the rectified read signal is greater than or less than the threshold signal. Adder circuit 74 subtracts the threshold signal from the rectified read signal to generate an offset signal that is provided to multiplier circuit 82. Multiplexer 76, as controlled by the comparison signal, provides either Gain A or Gain B to multiplier circuit 82. The Gain A signal is provided when the rectified read signal is greater than the threshold signal and the Gain B signal is provided when the rectified read signal is less than the threshold signal. Multiplier 82 multiplies the value of either the Gain A signal or the Gain B signal with the offset signal and generates the error signal. The error signal is typically provided to low pass filter 86 during the time in which the analog read signal is providing the header information.

Low pass filter 86 receives the error signal and averages the error signal to generate the output gain signal. Typically, once the header information is no longer being provided by the analog read signal, enable switch 84 opens, as shown in FIG. 2, which results in the decoupling of multiplier circuit 82 and low pass filter 86. During this time, low pass filter 86 still provides the output gain signal to variable gain amplifier 40 for use in amplifying the analog read signal when user data is being provided.

Thus, it is apparent that there has been provided, in accordance with the present invention, an automatic gain control circuit and method for quickly and accurately generating an output gain signal that satisfies the advantages set forth above. Although the preferred embodiment has been described in detail, it should be understood that various changes, substitutions, and alterations can be made herein. For example, a variety of different threshold values may be provided for use in automatic gain control circuit 44. One threshold may be provided to comparator 72 while a different or related threshold may be provided to adder circuit 74. Also, many of the signals provided to automatic gain control circuit 44 may be programmable signals. Furthermore, the direct connections illustrated herein could be altered by one skilled in the art such that two devices are merely coupled to one another through an intermediate device or devices without being directly connected while still achieving the desired results demonstrated by the present invention. Other examples of changes, substitutions, and alterations are readily ascertainable by one skilled in the art and could be made without departing from the spirit and scope of the present invention. While the invention has been particularly shown and described by the foregoing detailed description, it will be understood by those skilled in the art that various other changes in form and detail may be made without departing from the spirit and scope of the invention as defined by the following claims.

What is claimed is:

1. An automatic gain control circuit comprising:
    a rectifier circuit operable to receive a read signal and to generate a rectified read signal;
    an adder circuit operable to generate an offset signal by subtracting a threshold signal from the rectified read signal;
    a multiplier circuit operable to multiply the offset signal and a gain signal to generate an error signal; and
    a filter operable to filter the error signal and to provide an output gain signal in response.

2. The automatic gain control circuit of claim 1, further comprising:
    a comparator operable to generate a comparison signal indicating whether the rectified read signal is greater than or less than the threshold signal, and wherein the gain signal includes a first gain signal and a second gain signal; and
    a selection circuit operable to provide either the first gain signal or the second gain signal as determined by the comparison signal.

3. The automatic gain control circuit of claim 2, wherein the selection circuit provides the first gain signal when the comparison signal indicates that the rectified read signal is greater than the threshold signal.

4. The automatic gain control circuit of claim 2, wherein the selection circuit provides the second gain signal when the comparison signal indicates that the rectified read signal is less than the threshold signal.

5. The automatic gain control circuit of claim 2, wherein the selection circuit is a multiplexer.

6. The automatic gain control circuit of claim 2, further comprising:
    a first digital-to-analog converter operable to receive the first gain signal and to convert the first gain signal to an analog signal in response; and
    a second digital-to-analog converter operable to receive the second gain signal and to convert the second gain signal to an analog signal in response.

7. The automatic gain control circuit of claim 2, wherein the first gain signal and the second gain signal are programmable values.

8. The automatic gain control circuit of claim 1, wherein the rectifier circuit is a full wave rectifier.

9. The automatic gain control circuit of claim 1, wherein the rectifier circuit is operable to provide synchronous rectification.

10. The automatic gain control circuit of claim 1, wherein the adder circuit is operable to generate the offset signal by subtracting the rectified read signal from the threshold signal.

11. The automatic gain control circuit of claim 1, wherein the read signal is a filtered read signal.

12. The automatic gain control circuit of claim 1, wherein the threshold signal is a programmable value.

13. An automatic gain control circuit comprising:
    a rectifier circuit operable to receive a continuous-time read signal and to generate a rectified read signal;
    a comparator operable to receive the rectified read signal and a threshold signal and to provide a comparison signal in response;
    an adder circuit operable to receive the rectified read signal and the threshold signal and to subtract the threshold signal from the rectified read signal to generate an offset signal;
    a multiplier circuit operable to multiply the offset signal and a gain signal to generate an error signal; and
    a filter operable to filter the error signal and to provide an output gain signal in response.

14. The automatic gain control circuit of claim 13, wherein the gain signal includes a first gain signal and a second gain signal, and further comprising a selection circuit operable to provide either the first gain signal or the second gain signal as controlled by the comparison signal.

15. The automatic gain control circuit of claim 14, wherein the selection circuit provides the first gain signal when the comparison signal indicates that the rectified read signal is greater than the threshold signal.

16. The automatic gain control circuit of claim 14, wherein the selection circuit provides the second gain signal when the comparison signal indicates that the rectified read signal is less than the threshold signal.

17. The automatic gain control circuit of claim 14, further comprising:

a first digital-to-analog converter operable to receive the first gain signal and to convert the first gain signal to an analog signal in response; and a second digital-to-analog converter operable to receive the second gain signal and to convert the second gain signal to an analog signal in response.

18. A method for generating an output gain signal, the method comprising the steps of:

receiving a read signal;

generating a rectified read signal;

generating an offset signal that is the difference between a threshold signal and the rectified read signal;

generating an error signal by multiplying the offset signal and a gain signal; and filtering the error signal to generate an output gain signal.

19. The method of claim 18, further comprising the steps of:

generating a comparison signal indicating whether the rectified read signal is greater than or less than the threshold signal; and providing the gain signal as either a first gain signal or a second gain signal in response to the comparison signal.

20. The method of claim 18, wherein the read signal is a continuous-time read signal.

\* \* \* \* \*